(12) United States Patent
Cypher

(10) Patent No.: US 7,188,296 B1
(45) Date of Patent: Mar. 6, 2007

(54) ECC FOR COMPONENT FAILURES USING GALOIS FIELDS

(75) Inventor: Robert E. Cypher, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 545 days.

(21) Appl. No.: 10/696,891

(22) Filed: Oct. 30, 2003

(51) Int. Cl.
*H03M 10/00* (2006.01)

(52) U.S. Cl. .................... 714/755; 714/786

(58) Field of Classification Search ........... 714/755, 714/786, 86
See application file for complete search history.

(56) References Cited

U.S. PATENT DOCUMENTS

| | | | |
|---|---|---|---|
| 4,376,300 A | | 3/1983 | Tsang |
| 4,433,388 A | | 2/1984 | Oosterbaan |
| 4,434,459 A | | 2/1984 | Holland et al. |
| 4,556,977 A | * | 12/1985 | Olderdissen et al. ........ 714/782 |
| 4,584,681 A | | 4/1986 | Singh et al. |
| 4,604,751 A | | 8/1986 | Aichelmann, Jr. et al. |
| 4,617,664 A | | 10/1986 | Aichelmann, Jr. et al. |
| 4,665,537 A | * | 5/1987 | Moriyama ................ 714/755 |
| 4,949,342 A | | 8/1990 | Shimbo et al. |
| 5,020,060 A | | 5/1991 | Murai et al. |
| 5,058,115 A | | 10/1991 | Blake et al. |
| 5,077,737 A | | 12/1991 | Leger et al. |
| 5,164,944 A | | 11/1992 | Benton et al. |
| 5,177,747 A | | 1/1993 | Capps et al. |
| 5,228,046 A | | 7/1993 | Blake et al. |
| 5,233,614 A | | 8/1993 | Singh |
| 5,251,219 A | | 10/1993 | Babb |
| 5,255,226 A | | 10/1993 | Ohno et al. |
| 5,276,834 A | | 1/1994 | Mauritz et al. |
| 5,291,496 A | | 3/1994 | Andaleon et al. |
| 5,303,302 A | | 4/1994 | Burrows |

(Continued)

OTHER PUBLICATIONS

Dell Computer Corp., David Locklear, "Chipkill Correct Memory Architecture," Aug. 3, 2000, 3 pages.

(Continued)

*Primary Examiner*—Guy J. Lamarre
(74) *Attorney, Agent, or Firm*—Lawrence J. Merkel; Meyertons, Hood, Kivlin, Kowert & Goetzel, P.c.

(57) ABSTRACT

An apparatus comprises a check bit encoder circuit and a check/correct circuit. The apparatus operates on encoded data blocks, wherein each encoded data block includes a data block, a first plurality of check bits, and a second plurality of check bits. The encoded data block is logically arranged as an array of R rows and N columns, and each of the N columns comprises data bits from a respective one of the plurality of components. The first check bits form a first column of the array, and each of the first check bits covers a row of the array. The second check bits form a second column of the array and are defined to cover bits in the array according to a plurality of check vectors. Each check vector corresponds to a different bit in the array and is an element of a Galois Field ($GF(2^R)$). The check vectors are derived from a plurality of unique elements of $GF(2^R)$, each of which corresponds to a different column of the array. The check vector in row X of the column is the product, in $GF(2^R)$, of the unique element for that column and alpha$^x$, wherein alpha is a primitive element of $GF(2^R)$.

22 Claims, 11 Drawing Sheets

U.S. PATENT DOCUMENTS

| | | | |
|---|---|---|---|
| 5,463,644 | A | 10/1995 | Rodi et al. |
| 5,490,155 | A | 2/1996 | Abdoo et al. |
| 5,502,675 | A | 3/1996 | Kohno et al. |
| 5,537,421 | A | 7/1996 | Dujari et al. |
| 5,574,856 | A | 11/1996 | Morgan et al. |
| 5,606,662 | A | 2/1997 | Wisor |
| 5,640,353 | A | 6/1997 | Ju |
| 5,682,394 | A | 10/1997 | Blake et al. |
| 5,757,823 | A | 5/1998 | Chen et al. |
| 5,758,056 | A | 5/1998 | Barr |
| 5,790,715 | A * | 8/1998 | Iizuka .................. 382/309 |
| 5,812,564 | A | 9/1998 | Bonke et al. |
| 5,822,257 | A | 10/1998 | Ogawa |
| 5,867,642 | A | 2/1999 | Vivio et al. |
| 5,872,790 | A | 2/1999 | Dixon |
| 5,909,541 | A | 6/1999 | Sampson et al. |
| 5,923,682 | A | 7/1999 | Seyyedy |
| 5,928,367 | A | 7/1999 | Nelson et al. |
| 5,953,265 | A | 9/1999 | Walton et al. |
| 5,978,952 | A | 11/1999 | Hayek et al. |
| 5,987,628 | A | 11/1999 | Von Bokern et al. |
| 6,009,548 | A | 12/1999 | Chen et al. |
| 6,018,817 | A | 1/2000 | Chen et al. |
| 6,038,680 | A | 3/2000 | Olarig |
| 6,044,483 | A | 3/2000 | Chen et al. |
| 6,052,818 | A | 4/2000 | Dell et al. |
| 6,065,102 | A | 5/2000 | Peters et al. |
| 6,070,255 | A | 5/2000 | Dell et al. |
| 6,076,182 | A | 6/2000 | Jeddeloh |
| 6,101,614 | A | 8/2000 | Gonzales et al. |
| 6,115,828 | A | 9/2000 | Tsutsumi et al. |
| 6,141,789 | A | 10/2000 | Cypher |
| 6,158,025 | A | 12/2000 | Brisse et al. |
| 6,167,495 | A | 12/2000 | Keeth et al. |
| 6,181,614 | B1 | 1/2001 | Aipperspach et al. |
| 6,209,113 | B1 | 3/2001 | Roohparvar |
| 6,223,301 | B1 | 4/2001 | Santeler et al. |
| 6,233,716 | B1 | 5/2001 | Cypher |
| 6,233,717 | B1 | 5/2001 | Choi |
| 6,246,616 | B1 | 6/2001 | Nagai et al. |
| 6,282,686 | B1 | 8/2001 | Cypher |
| 6,301,680 | B1 | 10/2001 | Cypher |
| 6,301,780 | B1 | 10/2001 | Templeton |
| 6,367,046 | B1 | 4/2002 | Chapman et al. |
| 6,374,383 | B1 | 4/2002 | Weng |
| 6,393,597 | B1 | 5/2002 | Cypher |
| 6,453,440 | B1 | 9/2002 | Cypher |
| 6,473,880 | B1 | 10/2002 | Cypher |
| 6,477,682 | B2 | 11/2002 | Cypher |
| 6,505,305 | B1 | 1/2003 | Olarig |
| 6,704,838 | B2 | 3/2004 | Anderson |
| 6,738,947 | B1 | 5/2004 | Maeda |
| 6,766,493 | B1 | 7/2004 | Hoffman et al. |
| 6,779,150 | B1 | 8/2004 | Walton et al. |
| 6,973,613 | B2 | 12/2005 | Cypher |
| 6,976,194 | B2 | 12/2005 | Cypher |
| 6,996,766 | B2 | 2/2006 | Cypher |
| 2001/0001158 | A1 | 5/2001 | Tetrick |
| 2003/0093744 | A1 | 5/2003 | Leung et al. |
| 2003/0163777 | A1 | 8/2003 | Holt |
| 2003/0233611 | A1 | 12/2003 | Humlicek et al. |
| 2004/0054956 | A1 | 3/2004 | Byrd |

OTHER PUBLICATIONS

Dell, "A White Paper on the Benefits of Chipkill-Correct ECC for PC Server Main Memory," IBM Microelectronics Division, Nov. 1997, pp. 1-23.

"The IBM Eserver pSeries 690, Reliability, Availability, Serviceability (RAS)," IBM Technical White Paper, Sep. 2001, 24 pages.

"Parallel Parity," http://bbs-koi.uniinc.msk.ru/tech1/1994/er_cont/block.htm, 1994, 1 pg.

"Modulo-2 Arithmetic," http://bbs-koi.uniinc.msk.ru/tech1/1994/er_cont/modulo.htm, 1994, 1 pg.

"Introduction to Error Control," http://bbs-koi.uniinc.msk.ru/tech1/1994/er_cont/intro.htm, 1994, 1 pg.

Barker et al. "ASCII Table," http://www.eng2.uconn.edu/cse/Cour...08W/References/Ref_ASCIITable.html, Feb. 1998, 1 pg.

"Parity & Computing parity," http://bbs-koi.uniine.msk.ru/tech1/1994/er_cont/parity.htm, 1994, 2 pgs.

"Error Correction with Hamming Codes," http://bbs-koi.uniine.msk.ru/tech1/1994/er_cont/hamming.htm, 1994, 2 pgs.

Barker et al. "Hamming Code, Background Information," http://www.eng2.uconn.edu/cse/Courses/CSE208W/Hamming/Background.html, Feb. 1998, 3 pgs.

Barker et al., "Hamming Code, Theory," http://www.eng2.uconn.edu/cse/Courses/CSE208W/Hamming/Theory.html, Mar. 1998, 2 pgs.

"NUMA: Delivering the Next Level of Commodity SMP Performance," http://199.245.235.23/newsletters/html/vpoint5.html, 1996, 4 pgs.

Barker et al. "General Definitions," http://www.eng2.uconn.edu/cse/Cour...8W/References/Ref_Definitions.html, Feb. 1998, 3 pgs.

Barker et al. "Hamming Code, Lab Procedure," http://www.eng2.uconn.edu/cse/Courses/CSE208W/Hamming/Procedure.html, Jun. 1998, 3 pgs.

Burskirk, "32-Bit-Wide Memory Tolerates Failures," NT Tech Notes, Oct. 1990, p. 818.

C. L. Chen, "Symbol Error Correcting Codes for Memory Applications," IBM Corporation, IEEE, 1996, pp. 200-207.

IEEE Transactions of Computers, vol. 41, No. 2, Feb. 1992, 5 pages.

Hamada, et al., "A Class of Error Control Codes for Byte Organized Memory Systems -SbEC-(Sb+S)ED Codes-," IEEE Transactions of Computers, vol. 46, No. 1, Jan. 1997, 5 pages.

Costello, Jr., et al., "Applications of Error-Control Coding," IEEE Transactions on Information Theory, vol. 44, No. 6, Oct. 1998, pp. 2531-2560.

Ziegler, et al., "Cosmic Ray Soft Error Rates of 16-Mb DRAM Memory Chips," IEEE Journal of Solid-State Circuits, vol. 33, No. 2, Feb. 1998, pp. 246-252.

Peterson, et al., "Error-Correcting Codes," Second Edition, The MIT Press, 1972, pp. 357-373.

Shu Lin, "Error Control Coding, Fundamental and Applications," Prentice-Hall, 1983, pp. 503-525 and 532.

IBM Technical Disclosure Bulletin, "Memory Chip Failure-Detection Mechanism", Mar. 1991, vol. 33, No. 10A, XP000110029, pp. 240-242.

Saxena, et al., "Error Detection and Handling in a Superscalar, Speculative Out-of-Order Execution Processor System," IEEE, 1995, pp. 464-471.

Rolf Johansson, "Two Error-Detecting and Correcting Circuits for Space Applications," IEEE 1996, pp. 436-439.

IBM Technical Disclosure Bulletin, "Concurrent On-Lin Array Chip Sparing From Scrub-Assisted Fault Data," Dec. 1991, vol. 34, No. 7A, pp. 16-19.

Polianskikh, B. et al., "design and Implementation of Error Detection and Correction Circuitry for Multilevel Memory Protection," Multiple-Valued Logic 2000. ISMVL 2002. Proceedings 32nd IEEE International Symposium on May 5-18, 2002, pp. 89-95.

K. A. S. Immink, "A Practical Method for Approaching the Channel Capacity of Constrained Channels," Sep. 1997, IEEE Transactions on Information Theory, vol. 43, No. 5, pp. 1389-1399.

J. Zweig, et al., "TCP Alternate Checksum Options," Mar. 1990, 5 pages.

Craig Partridge, et al., "Performance of Checksums and CRCs over Real Data," 1995 ACM, pp. 68-76.

Jonathan Stone, et al., Performance of Checksums and CRC's over Real Data, !998 IEEE, ACM Transaction on Networking, vol. 6, No. 5, pp. 529-543.

Anh Vu, "Error Detection and Error Correction," Oct. 27, 1997, 7 pages.

Anastase Nakassis, "Fletcher's Error Detection Algorithm: How to Implement it Efficiently and How to Avoid the Most Common Pitfalls," ACM SIGCOMM Computer Communication Review, vol. 18, Issue 5, Oct. 1998, pp. 63-88.
Anarchriz, "CRC and How to Reverse it: A CRC Tutorial & c001 Way to Reverse CRC," Apr. 1999, 14 pages.
"Cyclic Redundancy Check," Aug. 2, 1997, 1 pages.
Eric Smith, "Memory Error Detection and Correction: An Introduction to Parity and ECC," Aug. 23, 1996, 2 pages.
Timothy Hsu, "How to Select System Memory," Jan. 9, 1999, 13 pages.
"Memory Tutorial," 1998, 3 pages.
Satran, Sheinwald Informational, "iSCSI CRC Considerations," May 7, 2001, 18 pages.
"A Short Spiel on 1-Bit Error Correction Codes," printed Aug. 11, 2001, 2 pages.
Rick Kelly, "Error Management Using DesignWare CRC and ECC," 2001 Synopsys, Inc., 5 pages.
ZDNet UK, "Parity RAM and ECC," PC Magazine Guide to Servers, 1999, 1 page.
"Before you start—Chapter 6: Break and Verify," © Laurence Soucy 1997/2001, 1 page.
"A Painless Guide to CRC Error Dection Algorithms," Version 3.00, Sep. 24, 1996, 19 pages.
"Error Control Systems for Digital Communication and Storage," Stephen B. Wicker, Prentice Hall 1995, pp. 100-123.
D.C. Bossen, "b-Adjacent Error Correction," IBM J. Res. And Development, vol. 14, No. 4, 1970, pp. 402-408.

* cited by examiner

|     | $c_0$ | $c_1$ | ... | $c_{N-1}$ |
|-----|-------|-------|-----|-----------|
| $r_0$ | | | | |
| $r_1$ | MD_0 | MD_1 | ... | MD_N-1 |
| ⋮ | | | | |
| $r_{R-1}$ | | | | |

Fig. 3

|  | $c_0$ | $c_1$ | | $c_{N-1}$ |
|---|---|---|---|---|
| $r_0$ | | | | |
| $r_1$ | Row Check Bits | Inner Check Bits | Data | |
| $\vdots$ | | | | |
| $r_{R-1}$ | | | | |

Fig. 4

$$\text{Check\_Vector}(r_x, c_y) = \text{key\_y} * \text{alpha}^x \quad (\text{in } GF(2^R)) \quad \longleftarrow 30$$

$$\text{row\_syn} * \text{key\_i} = \text{inner\_syn} \quad (\text{in } GF(2^R)) \quad \longleftarrow 32$$

$\text{Check\_Vector}(r_1, c_1)$ XOR $\text{Check\_Vector}(r_2, c_2)$ XOR
  $\text{Check\_Vector}(r_1, c_3)$ XOR $\text{Check\_Vector}(r_2, c_3)$ != 0  $\longleftarrow$ 34
  for any $r_1, r_2, c_1, c_2, c_3$ such that $((r_1, c_1)$ != $(r_2, c_2)$ and $c_1$ !=
  $c_3$) or $(c_1$ != $c_2)$ $$\text{key\_i} + \text{key\_j} \neq (\text{key\_i} + \text{key\_k}) * \text{alpha}^X \quad 0<=X<=R-1, i!=k, i!=j, j!=k$$
$$\longleftarrow 36$$

Fig. 5

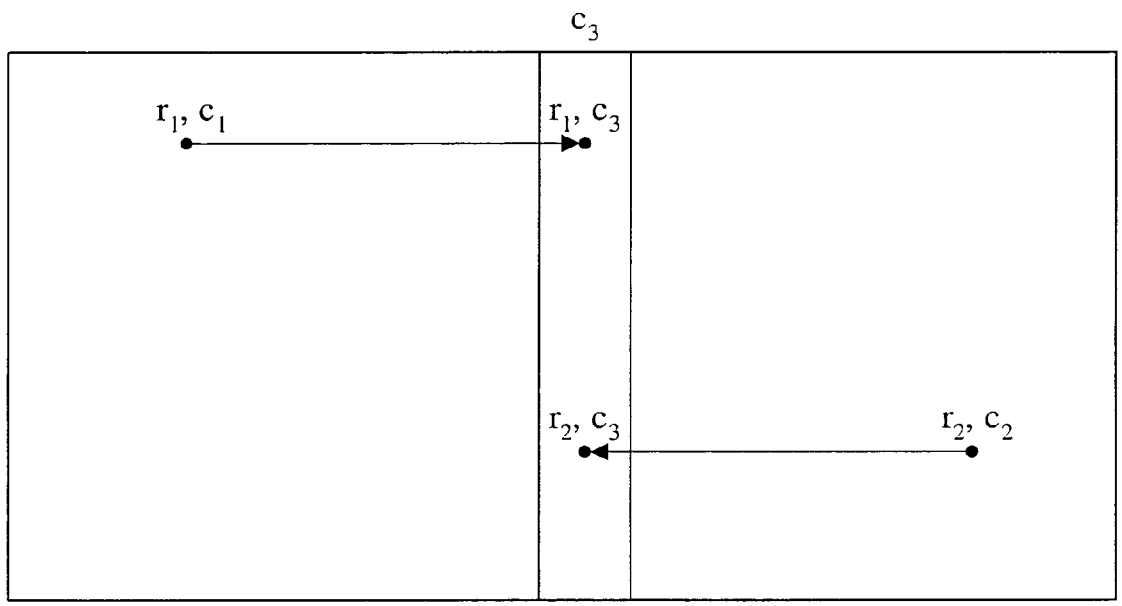

Fig. 6

ECC FOR COMPONENT FAILURES USING GALOIS FIELDS

BACKGROUND OF THE INVENTION

1. Field of the Invention

This invention is related to error correction code (ECC) systems.

2. Description of the Related Art

Error codes are commonly used in electronic systems to detect and correct data errors, such as transmission errors or storage errors. For example, error codes may be used to detect and correct errors in data transmitted via any transmission medium (e.g. conductors and/or transmitting devices between chips in an electronic system, a network connect, a telephone line, a radio transmitter, etc.). Error codes may additionally be used to detect and correct errors associated with data stored in the memory of computer systems. One common use of error codes is to detect and correct errors of data transmitted on a data bus of a computer system. In such systems, error correction bits, or check bits, may be generated for the data prior to its transfer or storage. When the data is received or retrieved, the check bits may be used to detect and correct errors within the data.

Component failures are a common source of error in electrical systems. Faulty components may include faulty memory chips or faulty data paths provided between devices of a system. Faulty data paths can result from, for example, faulty pins, faulty data traces, or faulty wires. Additionally, memory modules, which may contain multiple memory chips, may fail. Circuitry which drives the data paths may also fail.

Another source of error in electrical systems may be so-called "soft" or "transient errors". Transient memory errors may be an error caused by the occurrence of an event, rather than a defect in the memory circuitry itself. Transient memory errors may occur due to, for example, random alpha particles striking the memory circuit. Transient communication errors may occur due to noise on the data paths, inaccurate sampling of the data due to clock drift, etc. On the other hand, "hard" or "persistent" errors may occur due to component failure.

Generally, various error detection code (EDC) and error correction code (ECC) schemes are used to detect and correct memory and/or communication errors. For example, parity may be used. With parity, a single parity bit is stored/transmitted for a given set of data bits, representing whether the number of binary ones in the data bits is even or odd. The parity is generated when the set of data bits is stored/transmitted and is checked when the set of data bits is accessed/received. If the parity doesn't match the accessed set of data bits, then an error is detected.

Other EDC/ECC schemes assign several check bits per set of data bits. The check bits are encoded from various overlapping combinations of the corresponding data bits. The encodings are selected such that a bit error or errors may be detected, and in some cases the encodings may be selected such that the bit or bits in error may be identifiable so that the error can be corrected (depending on the number of bits in error and the ECC scheme being used). Typically, as the number of bit errors that can be detected and/or corrected increases, the number of check bits used in the scheme increases as well.

SUMMARY OF THE INVENTION

In one embodiment, an apparatus comprises a check bit encoder circuit and a check/correct circuit. The check bit encoder circuit is coupled to receive a data block, and is configured to generate a corresponding encoded data block comprising the data block, a first plurality of check bits, and a second plurality of check bits. Coupled to receive an encoded data block, the check/correct circuit is configured to detect an error in data from one of a plurality of components and correct the error using the first plurality of check bits, the second plurality of check bits, and the data block within the encoded data block. The encoded data block is logically arranged as an array of R rows and N columns, wherein R and N are positive integers and each of the N columns comprises data bits from a respective one of the plurality of components. The first plurality of check bits form a first column of the array, and each of the first plurality of check bits covers a row of the array. The second plurality of check bits form a second column of the array and are defined to cover bits in the array according to a plurality of check vectors. Each of the plurality of check vectors corresponds to a different bit in the array and is an element of a Galois Field ($GF(2^R)$). The plurality of check vectors are derived from a plurality of unique elements of $GF(2^R)$, each of which corresponds to a different column of the array. The check vector in row X of the column is the product, in $GF(2^R)$, of the unique element for that column and $alpha^X$, wherein alpha is a primitive element of $GF(2^R)$.

In some embodiments, the apparatus may be implemented in a memory controller and the plurality of components may be memory devices. In other embodiments, the apparatus may be implemented in a communication system and the plurality of components may be communication paths. A computer system comprising a memory controller implementing the apparatus, a plurality of memory devices, and at least one processor is also contemplated.

BRIEF DESCRIPTION OF THE DRAWINGS

The following detailed description makes reference to the accompanying drawings, which are now briefly described.

FIG. 3 is a block diagram illustrating a logical array of data bits forming one embodiment of a code word, indicating the storage of the bits in memory devices.

FIG. 4 is a block diagram illustrating the logical array of data bits and the storage of check bits in columns of the array.

FIG. 5 illustrates certain equations applicable to one embodiment of the code word.

FIG. 6 is a block diagram illustrating a pair of bits and their projections into a column of FIG. 3.

Figure 1:
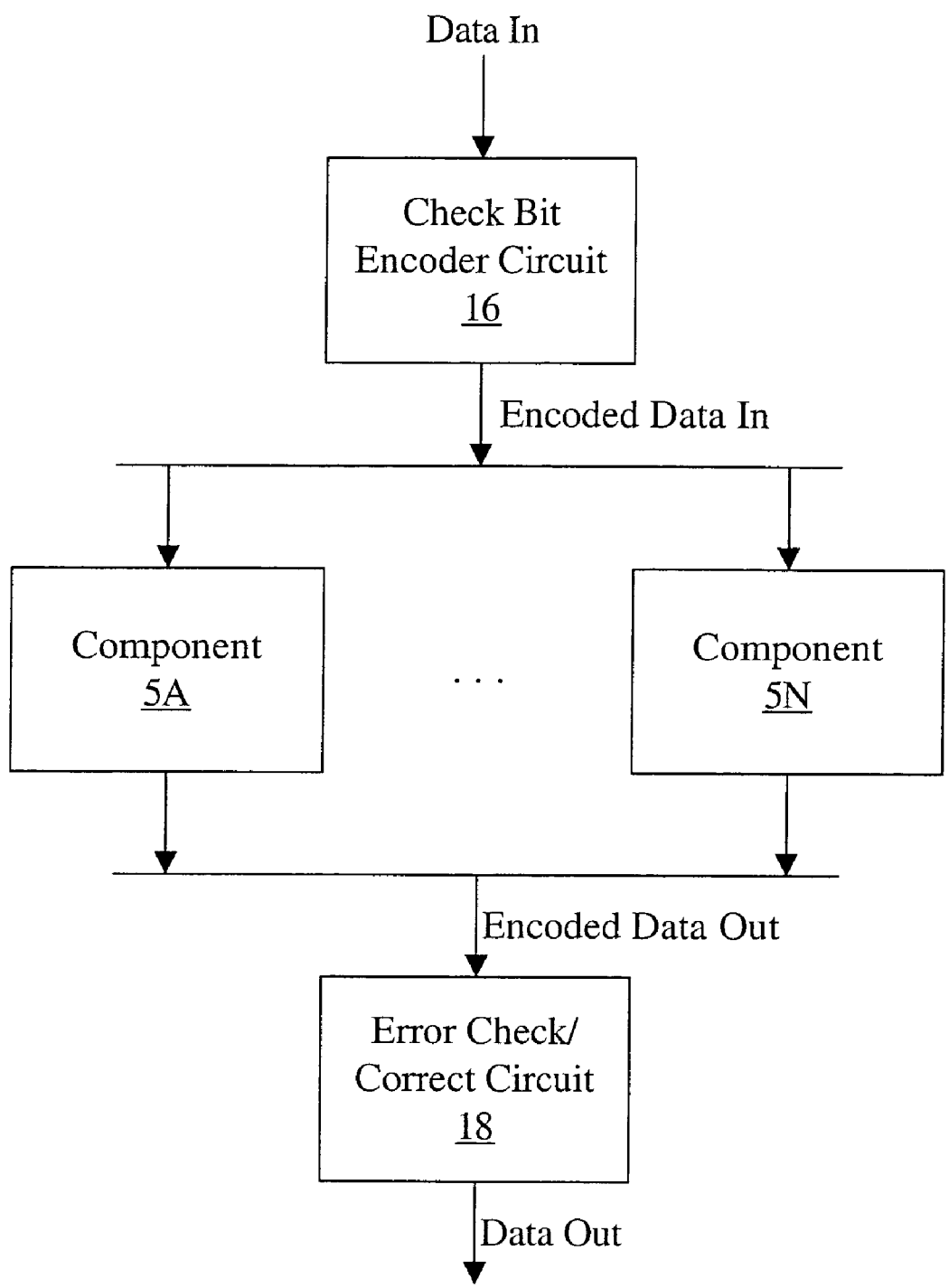
FIG. 1 is a block diagram of one embodiment of a check bit encoder circuit, a plurality of components, and an error check/correct (ECC) circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Apparatus Overview

Turning now to FIG. 1, a block diagram of one embodiment of an apparatus including a check bit encoder circuit 16, a plurality of components 5A–5N, and an error check/correct (ECC) circuit 18 is shown. In the embodiment of FIG. 1, the check bit encoder circuit 16 is coupled to receive input data (Data In in FIG. 1) and to provide corresponding encoded data (Encoded Data In in FIG. 1) to the components 5A–5N. The components 5A–5N are coupled to receive the encoded data from the check bit encoder circuit 16 and to provide encoded data (Encoded Data Out in FIG. 1) to the ECC circuit 18, which is configured to provide corresponding output data (Data Out in FIG. 1).

The apparatus may operate on data blocks, and may encode the data blocks with check bits to provide for error detection and correction of the data blocks. More particularly, the check bit encoder circuit 16 may receive a data block and may generate a corresponding encoded data block including the check bits that cover the data block. The check bit encoder circuit 16 may then transmit the encoded data block to the components 5A–5N. The components 5A–5N may transmit an encoded data block to the ECC circuit 18, which may decode the encoded data block, detect (and in some cases correct) errors in the data block, and transmit the output data block. Errors that may be introduced in the components 5A–5N (and/or the interconnect between the components 5A–5N, the check bit encoder circuit 16, and the ECC circuit 18) may be detected and possibly corrected.

As used herein, the term "component" includes one or more of: interconnect, circuitry, and/or storage. For example, in some embodiments described below, the check bit encoder circuit 16 and the ECC circuit 18 may be implemented in a memory controller. The components 5A–5N may comprise memory devices in the memory system to which the memory controller is coupled. In other embodiments described below, the check bit encoder circuit 16 may be implemented in a source that transmits data on a communication medium, and the ECC circuit 18 may be implemented in a destination that receives the data from the communication medium. In such embodiments, the components 5A–5N may comprise communication paths in a communication medium between the source and the destination. The components 5A–5N may further comprise circuitry in the communication medium (e.g. switches).

Generally, the encoded data block (also referred to herein as a "code word") may be logically arranged as an array of rows and columns, where the data in each column corresponds to one component 5A–5N. For example, if the components 5A–5N include storage, the data in a given component's column may be data from the code word that is stored in that component. If the components 5A–5N include interconnect, the data in a given component's column may be data from the code word that is transmitted on that component. If the components 5A–5N include circuitry that operate on the data, the data in a given component's column may be data from the code word that is operated on by that component.

In one embodiment, the check bits in the code word include a first set of check bits stored in a first column of the array (and thus corresponding to a first component) and a second set of check bits stored in a second column of the array (and thus corresponding to a second component). Each check bit in the first set of check bits (referred to herein as "row check bits") may cover the bits in the same row as that check bit. For example, the check bit encoder circuit 16 may generate each check bit as an exclusive OR (XOR) of the other bits in the same row. Thus, if the bits in each row of the code word are XOR'd by the ECC circuit 18, a resulting bit vector may represent a pattern of errors in one of the columns (corresponding to one of the components). That is, if the resulting bit vector is non-zero, the set bits in the resulting bit vector identify which rows in one column have an error. The second set of check bits may be defined using a Galois field (GF). Each column in the array may be assigned a key, which is a unique element of $GF(2^R)$, where R is the number of rows in the array. The key may be used as a check vector for the bit in row 0 of the corresponding column. A check vector may have a bit for each of the second set of check bits (corresponding to the row in the second column that stores that check bit) and may define which of the second set of check bits covers that bit. That is, each set bit in the check vector may indicate that the check bit in the corresponding position of the second column covers that bit. Check vectors for bits in the column may be generated by multiplying, in $GF(2^R)$, the key by alpha$^X$, where X is the row number storing the bit for which the check vector is being generated and alpha is a primitive element of $GF(2^R)$. A code defined in this fashion may permit detection and correction of a single component failure using 2R check bits. Furthermore, the code may permit a wide range of bits per component and numbers of components. For example, the number of components may exceed the number of bits per component using the code defined herein.

Additional details of one embodiment of the check bit definition (including some embodiments which provide single bit error correction after a failing component has been identified and double bit error detection prior to a component failure) are described below. The example of a memory controller is used for much of the description, but the check bit definition and other properties of the defined code may apply to any apparatus having any set of components 5A–5N.

As used herein, a data block is the unit of data over which check bits are generated. The error detection/correction capabilities may be measured in terms of the errors detected and corrected in a single data block. An encoded data block includes the data block and the corresponding check bits generated by the check bit encoder circuit 16 (and decoded by the ECC circuit 18 to detect errors and correct errors, where applicable).

Memory Controller Overview

Figure 2:
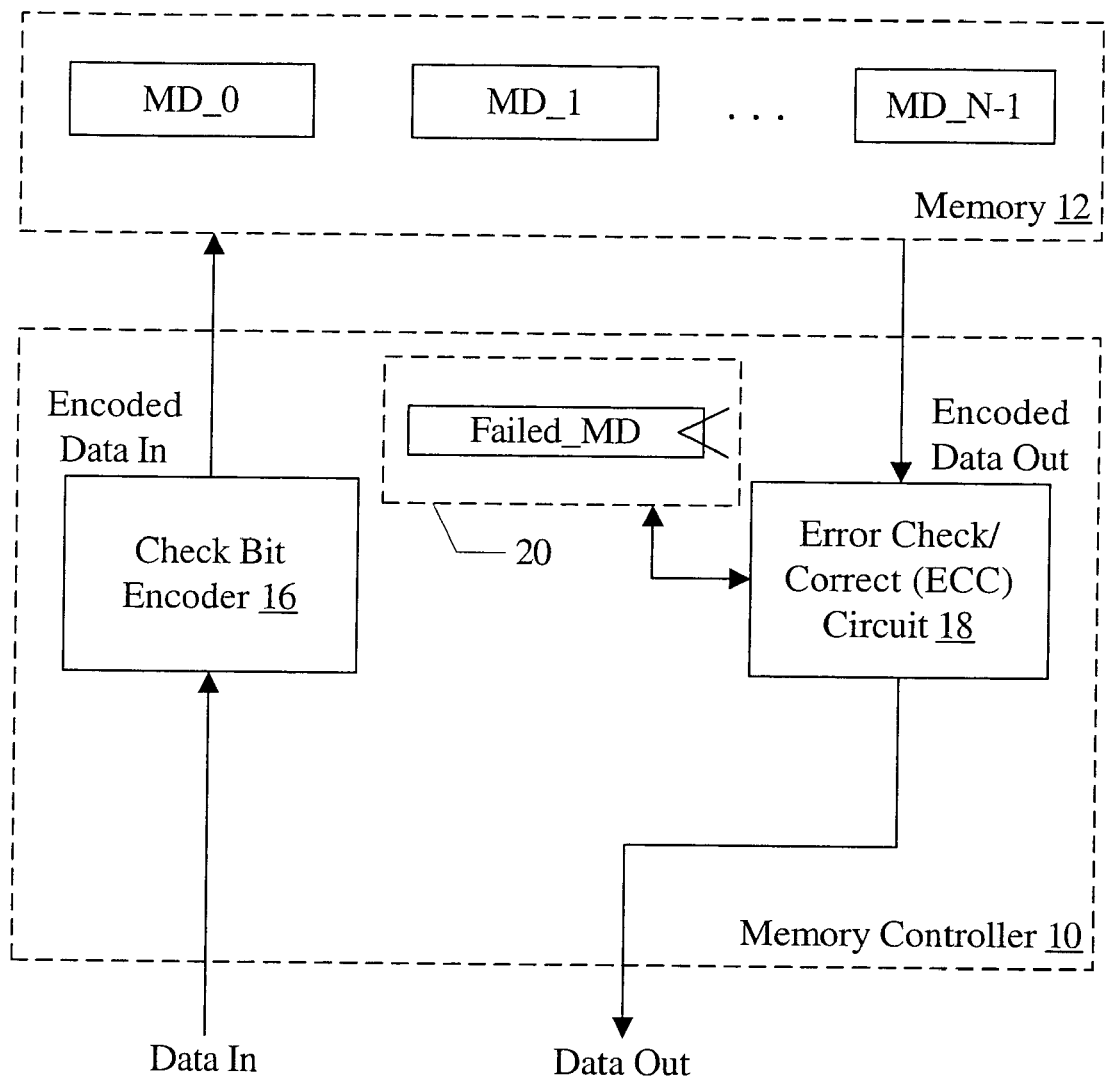
FIG. 2 is a block diagram of one embodiment of a memory controller.

Turning now to FIG. 2, a block diagram of one embodiment of a memory controller 10 and a memory 12 comprising a plurality of memory devices MD_0 to MD_N-1 is shown. There may be N memory devices total, where N is a positive integer. The memory controller 10 is coupled to the memory 12. In the illustrated embodiment, the memory controller 10 includes the check bit encoder circuit 16, the error check/correct (ECC) circuit 18, and a persistent state storage 20. The check bit encoder circuit 16 is coupled to receive data input to the memory controller (Data In), and to provide encoded data (Encoded Data In) to the memory 12 for storage. The ECC circuit 18 is coupled to receive encoded data read from the memory 12 (Encoded Data Out) to provide corresponding data (Data Out) to output from the memory controller 10. The ECC circuit 18 is coupled to the persistent state storage 20.

Figure 12:
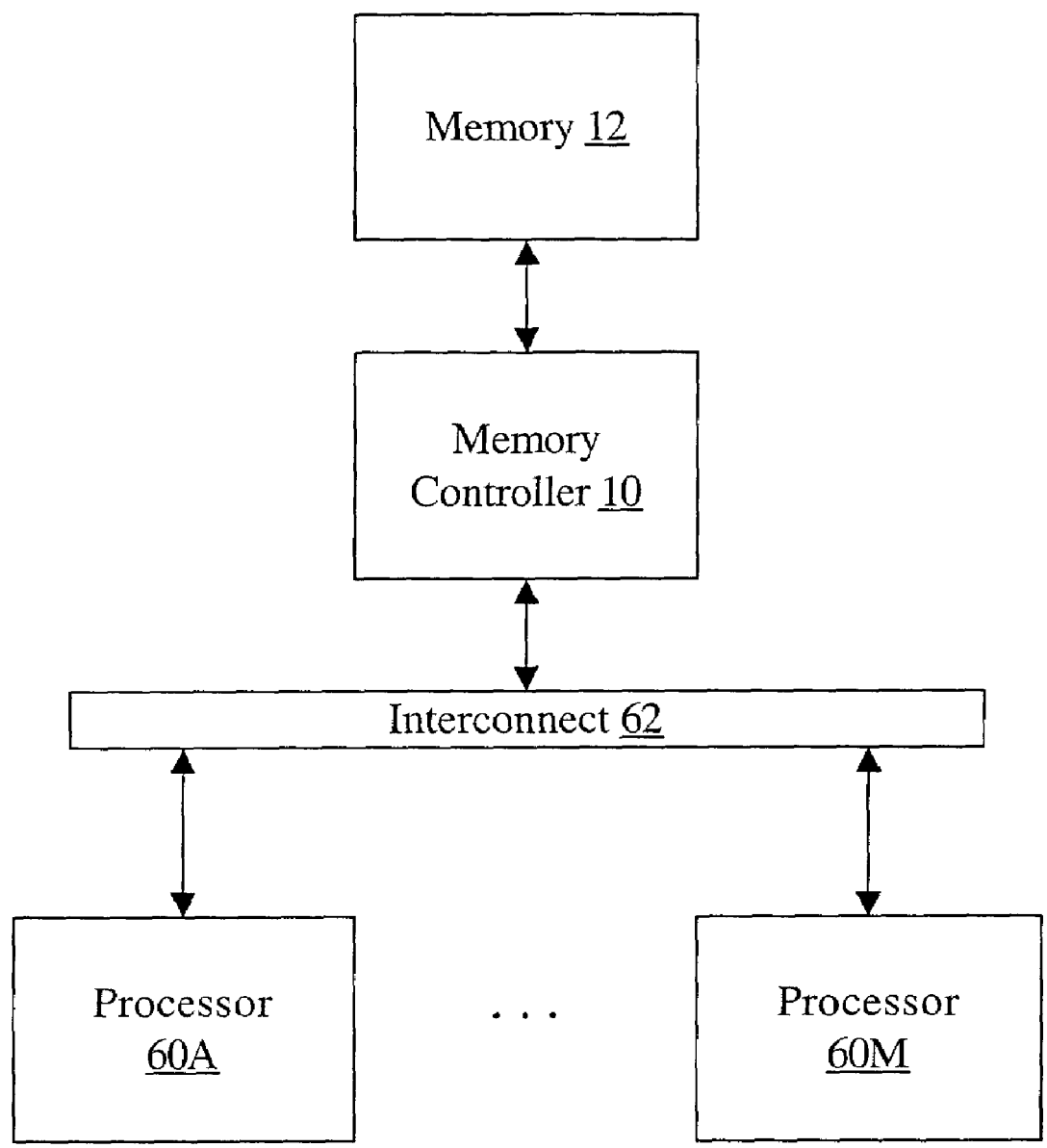
FIG. 12 is a block diagram of one embodiment of a computer system including one embodiment of the memory controller.

The memory controller 10 is coupled to receive read and write requests from various sources (e.g. processors and/or peripheral devices in a computer system including the memory controller 10, such as the computer system shown in FIG. 12). The memory controller 10 may have any interface for receiving the read and write requests (e.g. a bus interface, a packet interface, etc.). In one particular embodiment, the memory controller 10 may support input and output, unidirectional, source synchronous interfaces for transferring address and data packets comprising a request.

The memory controller 10 is configured to encode data to be written to the memory with a plurality of check bits, thus generating the encoded data to be stored in the memory. Generally, the encoded data comprises the data supplied to the memory controller and the check bits, arranged in a predetermined fashion for storage in the various memory devices of the memory 12. Additionally, when encoded data is read from the memory 12, the ECC circuit 18 is configured to decode the encoded data to detect certain errors in the data and, in some cases, to correct the errors. The corrected data is supplied as an output of the memory controller 10.

The data written to the memory 12 by the memory controller 10 may comprise data from a write request received by the memory controller 10 ("Data In" in FIG. 2). In some embodiments, data written to the memory 12 may comprise data read from the memory 12 for which an error was detected and corrected. For example, in some embodiments, single bit errors may be corrected. In some embodiments, the memory controller 10 may track the number of recent correctable errors, and if the number is less than a threshold, the memory controller 10 may assume that the error is a transient error and may write the data (with the error corrected), back to the memory 12. In other embodiments, if a correctable error is detected during a memory read, the memory controller 10 may repeat the read to see if the error occurs again. If no error is detected in the repeated read, then the error may have been a transient signal error and no correction in the memory 12 is needed. If an error is detected again, then the memory controller 10 may write the corrected data back to memory. The memory controller 10 may again repeat the memory read, and if the same error occurs again then a hard error (component failure) may be detected.

Figure 9:
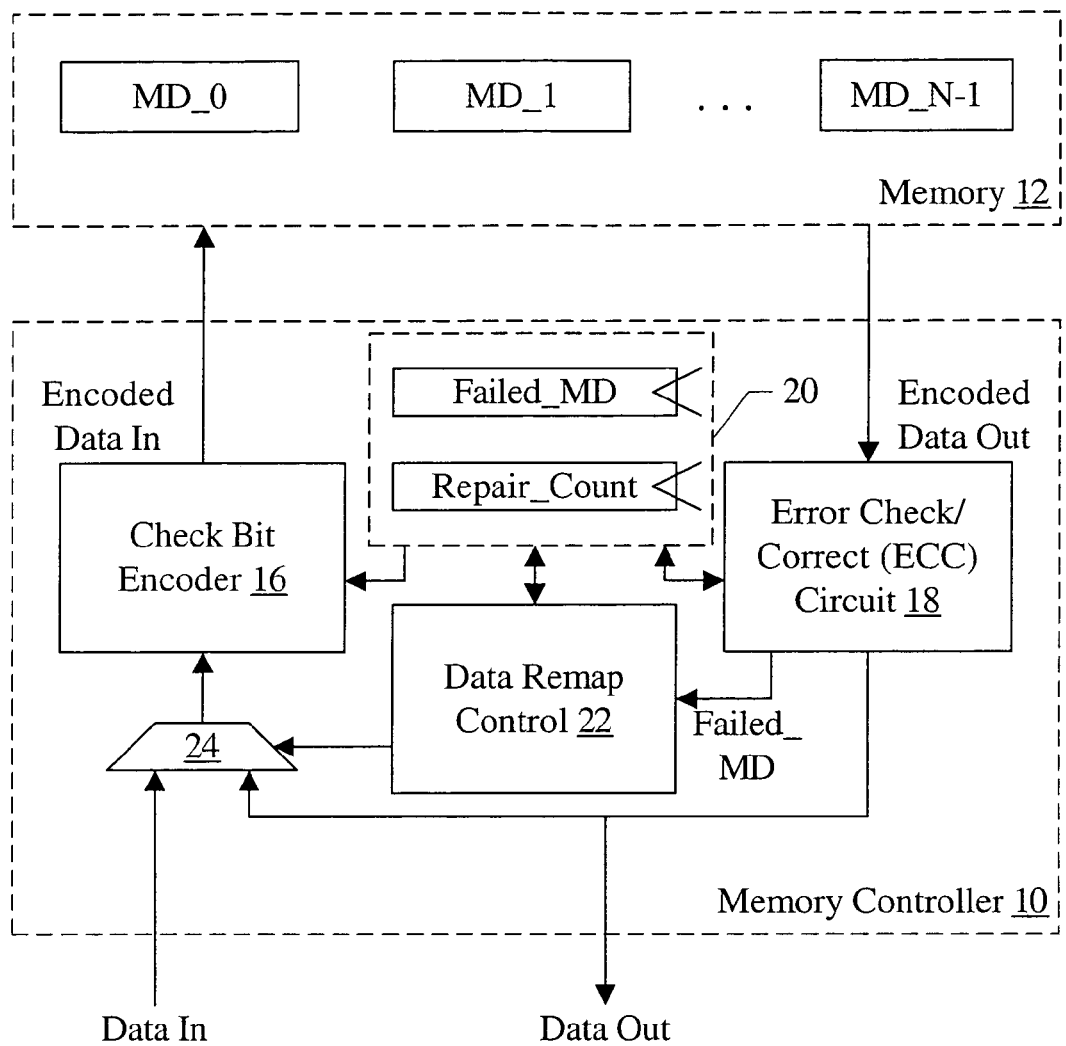
FIG. 9 is a block diagram of a second embodiment of a memory controller.

The memory controller 10 may be configured to detect (and in some cases to correct) various errors through the encodings of the check bits. For example, as mentioned above, in one embodiment, the check bits may provide for detection and correction of the failure of a memory device. The correction may include reconstructing the data that was stored in the failed memory device using the check bits and the data from the other memory devices. The correction may also include "mapping out" the failed memory device such that the failed memory device is no longer used to store bits of encoded data blocks (an example of such an embodiment is shown in FIG. 9 and described in more detail below). In some embodiments, following detection of the failure of a memory device, the check bit encodings may continue to provide for single bit error detection and correction. In such an embodiment, double bit error detection may also be provided prior to the detection of a failed memory device if the bit errors occur in different memory devices. In still another embodiment, the check bit encodings provide for the detection and correction of a failed memory device as well as the detection and probabilistic correction of a failed memory module.

The persistent state storage 20 is configured to record state information regarding the persistent failures which have been detected by the memory controller 10. In the illustrated embodiment, the persistent state may include an indication of a failed memory device (Failed_MD in FIG. 2). The persistent state storage 20 may be formed from any type of persistent storage (e.g. registers, memory arrays, etc.).

A write request may supply up to a predetermined amount of data to be written to the memory, and similarly a read request may transfer up to a predetermined amount of data from the memory. For example, in one embodiment, a read or write request may supply a cache line of data. The cache line may be of any size (e.g. 32 bytes, 64 bytes, 128 bytes, etc.). In one particular implementation, a cache line may comprise 64 bytes of data (512 bits). The data supplied via a write request may further include metadata bits in some embodiments. Generally, metadata bits may be used to describe various properties of the corresponding cache line (e.g. type of data, coherency information, etc.). Any metadata used by the producers and consumers of the data (e.g. processors) may be encoded in the metadata.

The cache line may be divided into one or more data blocks. Check bits are generated for each data block independent of the other data blocks corresponding to a given cache line. The encoded data block (comprising the data bits, metadata bits if applicable, and the check bits arranged in a predetermined fashion) corresponding to each data block is referred to as a code word herein. A portion of the code word may be stored in each memory device MD_0 to MD_N-1.

As used herein, a memory device includes any memory packaged into a single device package having pins for accessing the memory device for writing and reading data stored therein. For example, a memory device may include a dynamic random access memory (DRAM) of any type (e.g. asynchronous DRAM, synchronous DRAM (SDRAM), RAMBUS DRAM (RDRAM), double data rate SDRAM (DDR SDRAM), etc.). A memory device may also include static RAM (SRAM), flash memory, etc. A memory device may include any memory which is subject to transient or persistent errors. In some embodiments, a memory device may be a single chip. In some cases, two or more memory devices may be included on a memory module. A memory module is a circuit board to which two or more memory devices have been attached. For example, memory modules may include dual inline memory modules (DIMMs), single inline memory modules (SIMMs), and any other type of memory modules.

As used herein, a check bit refers to a bit which is generated from two or more data bits and/or other check bits for providing error detection in the data bits/check bits (and optionally, depending on the definition of the check bits as a whole, error correction). A first check bit is referred to as "covering" a given data bit or given check bit if: (i) the given data bit/check bit is used in the generation of the first check bit (and thus the first check bit aids in the error detection/correction of that data bit/check bit); or (ii) the given check bit is the first check bit (that is, the first check bit may cover itself). For example, a check bit may be generated from two or more data bits/check bits by exclusive OR (XOR) or exclusive NOR (XNOR) of the two or more data bits/check bits.

It is noted that various buffers and/or queues (not shown) may be included in the memory controller 10 as desired for buffering data. Furthermore, read and write requests to the memory 12 generally include an address to select the memory locations within each memory device that are read or written, control lines to control the access to the memory, etc., which have not been illustrated in FIG. 2. Thus, the memory controller 10 may include other circuitry (not shown) controlling the read and write of the memory 12. Additionally, the memory controller 10 may include circuitry (not shown) for interfacing to the source(s) of memory requests.

The memory 12 may have any desired arrangement. For example, the memory 12 may be arranged into a plurality of banks. The memory devices MD_0 to MD_N−1 may be part of one bank, and other memory devices (not shown) may be part of other banks. As mentioned above, the memory devices may be configured onto memory modules, which may be part of one or more memory banks, as desired.

Figure 3:
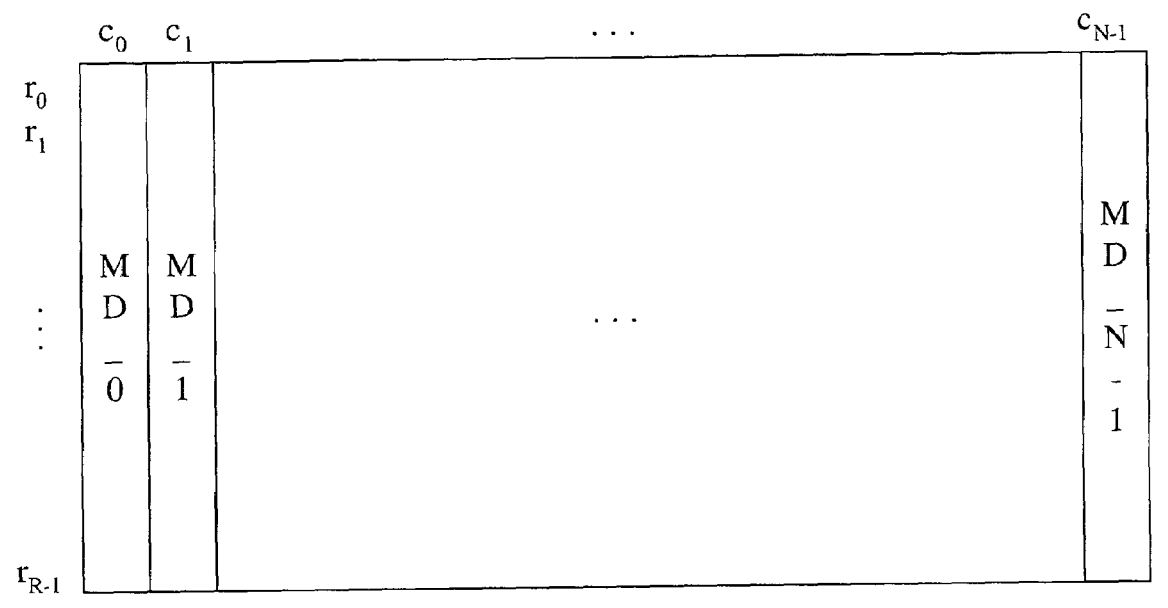

FIG. 3 is a block diagram of one embodiment of a code word. Other embodiments are possible and contemplated. FIG. 3 illustrates the code word logically arranged as an array of rows and columns. Each column comprises the bits stored in one of the memory devices. Thus, the number of rows is equal to the number of bits of the code word supplied by each memory device (R bits, where R is a positive integer). Thus, the rows are numbered $r_0$ to $r_{R-1}$. For example, column 0 ($c_0$) are the bits of the code word stored in memory device 0 (MD_0), column 1 ($c_1$) are the bits of the code word stored in memory device 1 (MD_1), etc. up to column N−1 ($c_{N-1}$) having the bits of the code word stored in memory device N−1 (MD_N−1).

Error Code Definition

One embodiment of a definition of the check bit encodings to provide various error detection/correction properties based on the code word shown in FIG. 3 will next be described with reference to FIG. 4. For this embodiment, the check bits include a set of row check bits and a set of inner check bits. The row check bits are stored in a selected column of the code word (e.g., column zero in FIG. 4, although any column may be selected). The inner check bits are stored in a different column than the row check bits (e.g. column one in FIG. 4, although any column may be selected). The remaining columns store the data for which error detection/correction is being provided (which may include metadata, in some embodiments).

Each row check bit covers the bits that are in each other column of the code word and in the same row as that row check bit. For example, the row check bit in row $r_0$ covers the bits that are in each other column and in row $r_0$.

Decoding the code word to detect an error may include XORing the bits in each row to generate a corresponding bit of a row syndrome. If the row syndrome is not zero, then an error has occurred. The decoding may further include other manipulations of the data and the row syndrome (and an inner syndrome over the inner check bits) to determine what the failure is and, in some cases, the correction to be performed. The assignment of inner check bits to cover various data bits causes an error in a given position in the logical array to generate the inner syndrome, and by appropriate assignment of check bits to data bits, various error detection and correction properties may be realized.

Generally, the row check bits may be used to identify the failure of a memory device, and to reconstruct the data bits which were stored in the failed memory device. For example, row check bits may be the XOR of each other bit in the same row, and thus may detect that a given bit in the row has changed (e.g. due to the failure of the memory device which stores that bit). By XORing the other bits in the row and the row check bit, the changed bit may be reconstructed. Alternatively, once the failed column is identified, the bits in the row syndrome that are non-zero identify bits in the failed column that are to be inverted to reconstruct the data from the failed column.

The failure of a memory device causes at least one row to indicate a failure. That is, the row check bits identify which rows of the logical array contain an error, but not which column the errors are in. The inner check bits may be assigned to cover various data bits to identify which particular memory device (which column of the code word array) has failed (thus permitting the reconstruction of the data from the failed memory device and the remapping of the code word to exclude the failed memory device, if desired). For the remainder of this discussion, "failed memory device" or "failed DRAM" and "failed column" may be used. The failed column may be the column of the array which corresponds to the failed memory device or failed DRAM.

More particularly, a check vector is assigned to each bit in the array. The check vector corresponding to a given bit defines which of the inner check bits cover the given bit. Given a set of check vectors assigned to the array, a given inner check bit may be generated (e.g. by the check bit encoder circuit 16) by combining each of the bits in the array covered by the given inner check bit (as indicated by the corresponding check vectors). For example, the check vector may be a vector of R bits, each location of which corresponds to a row in the inner check bit column. If the bit in the check vector is set, the corresponding inner check bit covers the bit to which the check vector is assigned.

The check vectors may be defined as follows. For each column, a "key" is selected from the elements of $GF(2^R)$. The key for each column is unique. That is, the keys are different elements of $GF(2^R)$. The check vectors for the rows in a given column may be generated by multiplying, in $GF(2^R)$, the key by $alpha^X$, where X is the row number and alpha is a primitive element of $GF(2^R)$. The check vector for row 0 ($r_0$) of a given column may be equal to the key assigned to the given column (since multiplying an element by $alpha^0$ results in that element). This equation is shown in FIG. 5 (reference numeral 30), where Check_Vector($r_x$, $c_y$) is the check vector for row x and column y and key_y is the key for column y.

Given the above definition of the check vectors, the equation at reference numeral 32 may be used to detect a failure of one column (where the arithmetic is performed in $GF(2^R)$). In the equation 32, row_syn is the row syndrome, key_i is the key for column i, and inner_syn is the inner syndrome. The row syndrome is a bit vector, viewed as an element of $GF(2^R)$, where each bit is calculated by XORing the bits in one of the rows of the array (including the row check bit in that row). The inner syndrome is a bit vector, viewed as an element of $GF(2^R)$, where each bit is calculated by XORing the bits covered by the corresponding inner check bit with the inner check bit. Thus, if the row syndrome is non-zero, the inner syndrome divided by the row syndrome (in $GF(2^R)$) is equal to key_i. By comparing result of the division to each of the keys, the failed column may be identified (and the row syndrome may be used to reconstruct the data from the failed column). If none of the keys match the result of the division, then the error is uncorrectable. Since one of the properties of division in $GF(2^R)$ is that, given a particular divisor, a unique result is generated for each dividend, any single component failure is correctable. An uncorrectable error may occur if more than one component fails, or if more than a double bit error occurs in addition to a component failure (if the keys are selected according to the additional constraints described below).

As described above, Galois field arithmetic is used in the error code. Generally, a Galois Field is a finite field of numbers having the property that arithmetic operations on field elements (numbers in the field) have a result in the field (i.e. another element of the field). Addition may be defined in a Galois Field of size $2^R$ to be bitwise exclusive OR (XOR) of the elements. A primitive element (alpha) of a Galois Field is an element used to generate the other elements of the Galois Field. Each of the elements of the Galois Field may be written as the sum of powers of alpha. There is at least one primitive element for a Galois field, but there may be more than one in some instances. In one embodiment, alpha is defined to satisfy the equation:

$$\text{alpha}^r = 1 + \text{alpha}^2 + \text{alpha}^3 + \text{alpha}^5$$

although alpha may be defined differently in other embodiments. In another view, any element of the Galois Field may be the linear combination of powers of alpha up to R-1, where the powers used in the linear combination correspond to bit positions in the element that have set (binary one) bits.

In addition to detecting the failure of a memory device, additional constraints on the selection of the keys may be applied to provide double bit error detection prior to a memory device failing and to provide single bit error correction after a memory device failure is detected. As mentioned above, after identifying that a given memory device (column) has failed, the remaining columns (including the row check bit column) may be used to reconstruct the failed column. If one of the remaining columns has a single bit error, that single bit error is then projected into the failed column. FIG. 6 may be used to illustrate the projection. If the column labeled $c_3$ has failed, and the bit $(r_1, c_1)$ is in error, the reconstruction of bit $(r_1, c_3)$ is also in error (since $(r_1, c_1)$ is used to reconstruct $(r_1, c_3)$). The two errors are detectable if the XOR of the check vectors assigned to the bit $(r_1, c_3)$ and the bit $(r_1, c_1)$ is not zero. Additionally, the errors are uniquely detectable (and thus correctable) among the possible errors that may be generated during the reconstruction if, for some other bit $(r_2, c_2)$ and its projection into the failed column $(r_2, c_3)$, the XOR of the check vectors assigned to the bits $(r_2, c_2)$ and $(r_2, c_3)$ is not equal the XOR of the check vectors assigned to the bits $(r_1, c_1)$ and $(r_1, c_3)$. If the above two conditions hold for each combination of rows $r_1$ and $r_2$ and each combination of columns $c_1$, $c_2$, and $c_3$ where $(r_1, c_1)$ is not equal to $(r_2, c_2)$ and $c_3$ is not equal to $c_1$, then the inner check bits provide for single bit error detection and correction after a memory device failure is detected. A more strict condition is illustrated in the equation at reference numeral 34 in FIG. 5, and thus if the keys are selected to satisfy the equation 34, single bit error correction is provided after a memory device failure is detected.

To provide double bit error detection prior to a memory device failing, the XOR of the check vectors for a memory device failure that causes two bits to fail (e.g. $(r_1, c_3)$ and $(r_2, c_3)$ for a failure in column $c_3$ in FIG. 6) is different than the XOR of the check vectors for two bits involved in a double bit failure (e.g. $(r_2, c_2)$ and $(r_1, c_1)$ in FIG. 6). Stated in another way, for any rows $r_1$, $r_2$ and columns $c_1$, $c_2$, and $c_3$, wherein $c_1$ is not equal to $c_2$; check_vector$(r_2, c_2)$ XOR check_vector$(r_2, c_3)$ XOR check_vector$(r_1, c_1)$ XOR check_vector$(r_1, c_3)$ is not equal to zero. This equation is covered by the equation 34, and thus that equation is sufficient to show that double bit error detection prior to a memory device failing is provided.

Since the check vectors for each row x in a given column are formed by multiplying the key assigned to the given column by alpha$^x$, another way to view the equation 34 is the equation given at reference numeral 36 in FIG. 5, wherein the addition and multiplication in the equation 36 is in $GF(2^R)$.

In one embodiment, the key for the column storing the row check bits (e.g. column $c_0$ in FIG. 4) may be selected as the element 0 (e.g. all bits in the element are binary zero). In this manner, no inner check bits cover the row check bits, and thus any circularity in the definition of the row check bits and the inner check bits may be eliminated. With this definition, the inner check bits may be computed first (e.g. by the check bit encoder circuit 16) and then the row check bits may be computed over the inner check bits and the data bits. Additionally, in one embodiment, the key for the column storing the inner check bits (e.g. column $c_1$ in FIG. 4) may be selected as the element having all binary zeros except for a binary one in the least significant position. Multiplying such an element by alpha$^X$ has the effect of shifting the binary one to position X. Thus, the inner check bit X may be stored in row X of the column storing the inner check bits.

Figure 7:
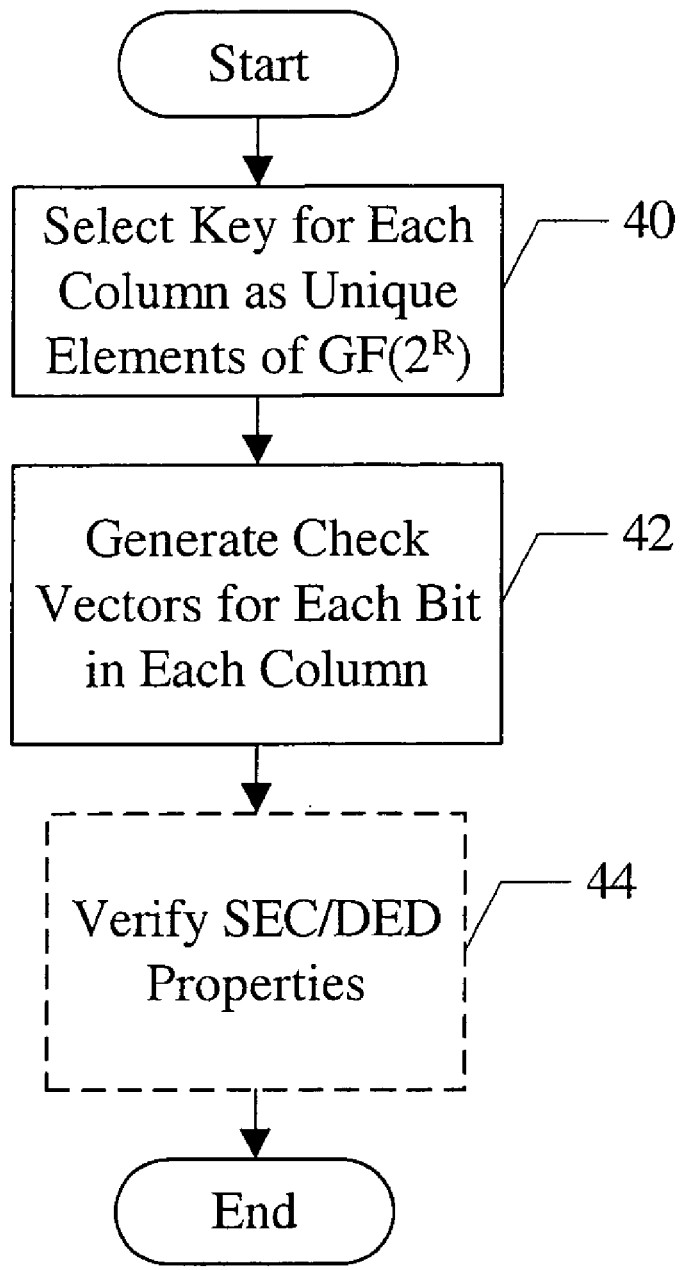
FIG. 7 is a flowchart illustrating a method for creating a code for detecting component failures.

Turning now to FIG. 7, a flowchart illustrating one embodiment of a method for defining the error code for the code word described above is shown. A key is selected for each column in the array as unique elements of $GF(2^R)$ (block 40). Check vectors for each bit in each column are generated from the keys (e.g. according to the equation 30) (block 42). Optionally, if the error code is desired to have the single bit error correction (SEC) and double bit error detection (DED) properties described above, then SEC/DED properties are verified (block 44) and the selection of keys may be changed to ensure the SEC/DED properties.

Figure 8:
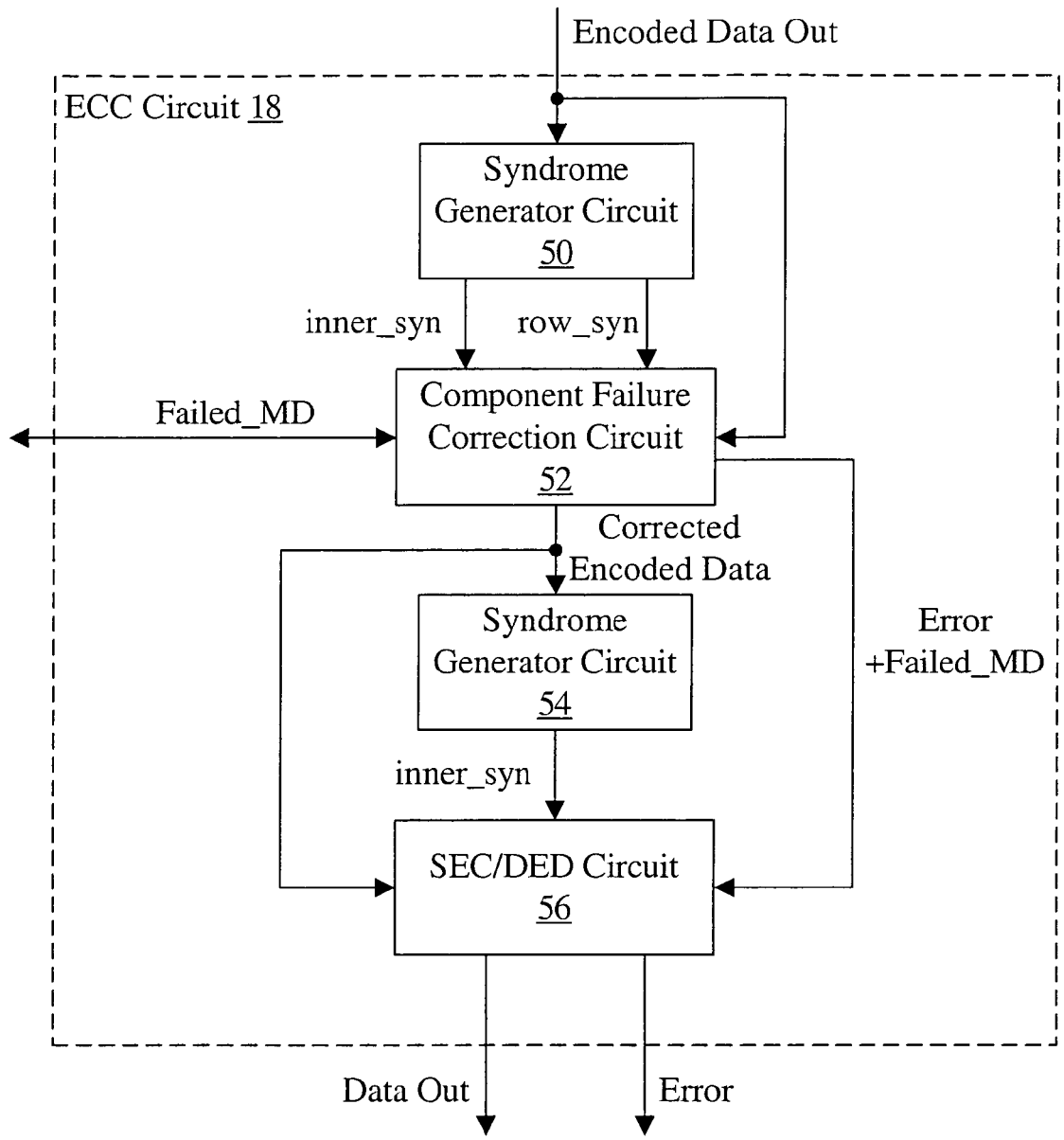
FIG. 8 is a block diagram illustrating one embodiment of an ECC circuit shown in FIG. 2 in more detail.

Turning now to FIG. 8, a block diagram illustrating one embodiment the ECC circuit 18 is shown. In the illustrated embodiment, the ECC circuit 18 includes a syndrome generator circuit 50, a component failure correction circuit 52, a syndrome generator circuit 54, and a SEC/DED circuit 56. The syndrome generator circuit 50 is coupled to receive the code word (Encoded Data Out), and is configured to generate the inner syndrome (inner_syn) and the row syndrome (row_syn). The component failure correction circuit 52 is coupled to receive the code word and the inner syndrome and row syndrome from the syndrome generator circuit 50. Additionally, the component failure correction circuit 52 is coupled to receive the failed_MD indication from the persistent state storage 20, and may also update the failed_MD indication in the persistent state storage 20. The component failure correction circuit 52 is coupled to provide corrected encoded data to the syndrome generator circuit 54 and to the SEC/DED circuit 56. Additionally, the component failure circuit 52 may be coupled to provide an error indication and the failed_MD indication to the SEC/DED circuit 56. The syndrome generator circuit 54 is coupled to provide an inner syndrome generated from the corrected encoded data to the SEC/DED circuit, which is coupled to provide the output data and an error signal.

The syndrome generator circuit 50 may generate the row syndrome and inner syndrome for the received code word, as described above. The component failure correction circuit 52 is configured to reconstruct the data from the failed component (e.g. memory device, in this embodiment) given the row syndrome, the inner syndrome, and the code word.

In one embodiment, the component failure correction circuit 52 may comprise circuitry to divide the inner syndrome by the row syndrome (if the row syndrome is non-zero) in $GF(2^R)$, and circuitry to compare the result to each of the keys to locate the failed column. Alternatively, the component failure correction circuit 52 may comprise circuitry to multiply the row syndrome by each of the keys (in $GF(2^R)$), and circuitry to compare the results to the inner syndrome to locate the failed column. The component failure correction circuit 52 may reconstruct the data in the failed column to generate the corrected encoded data. Additionally, the failure may be recorded in the persistent state storage 20. Furthermore, if the row syndrome and/or the inner syndrome is non-zero and there does not exist a column i with a key_i satisfying the equation at reference numeral 32 in FIG. 5, an uncorrectable error may be signalled. The error may be uncorrectable, e.g., if it is a double bit error.

Additionally, the failed_MD value from the persistent state storage 20 indicates whether or not a component failure has been previously identified. If a component failure has been previously identified, the component failure correction circuit 52 may instead use the failed_MD to locate the failed column and correct the failure.

The syndrome generator circuit 54 receives the corrected encoded data from the component failure correction circuit 54, and generates a new inner syndrome over the corrected encoded data. If the inner syndrome generated by the syndrome generator circuit 54 is non-zero, then a single bit error may be corrected (even if a component failure has been identified) or a double bit error may be detected (if a component failure has not been identified). The SEC/DED circuit 56 performs these error detections/corrections. For example, the SEC/DED circuit 56 may correct the single bit error by calculating the inner syndrome that would occur for each bit in the array if that bit were in error given the ID of the failed_MD, and comparing the calculated inner syndromes to the inner syndrome from the syndrome generator circuit 54. A match identifies the corresponding bit as the error, and the bit may be inverted to correct the error. The calculated inner syndrome for a given bit may be the bitwise XOR of the check vector for that bit and the check vector of the projection of that bit into the failed column. If none of the calculated inner syndromes matches the error, the error is signalled as uncorrectable (e.g. using the error signal shown in FIG. 8). The error may be uncorrectable, e.g., if it is a double bit error.

Turning now to FIG. 9, a block diagram of a second embodiment of a memory controller 10 and the memory 12 is shown. Similar to the embodiment of FIG. 2, the embodiment of FIG. 9 includes a check bit encoder circuit 16, an error check/correct (ECC) circuit 18, and a persistent state storage 20. In this embodiment, the persistent state storage includes the failed_MD indication as well as a repair count indication (repair_count). Additionally, the illustrated embodiment of FIG. 9 includes a data remap control circuit 22 and a multiplexor (mux) 24. The check bit encoder circuit 16 is coupled to the persistent state storage 20 and to receive data from the mux 24. The ECC circuit 18 is coupled to receive encoded data read from the memory 12 (encoded data out) to provide corresponding data (data out) to the mux 24 and to output from the memory controller 10. The ECC circuit 18 is coupled to the persistent state storage 20 and to provide a failed_MD signal to the data remap control circuit 22. The data remap control circuit 22 is coupled to the persistent state storage 20 and to the mux 24.

The data written to the memory 12 by the memory controller 10 may comprise data from a write request received by the memory controller 10 ("data in" in FIG. 1) or may comprise data read from the memory 12 for which an error was detected. For transient errors (e.g. single bit errors) in the data read from the memory 14, the corrected data may be written back to the memory 12. In other cases (e.g. a memory device failure), the data remap control circuit 22 may cause each encoded data block having bits stored in the failing memory device to be read and rewritten to the memory, remapped to avoid storing bits in the failing memory device. The repair_count in the persistent state storage 20 may be used to track how much of the data has been remapped to exclude the failed memory device. For example, the memory 12 may include a spare memory device that may be used in place of the failing memory device. In either error case, the data remap control circuit 22 may select the data provided from the ECC circuit 18 through the mux 24 to the check bit encoder circuit 16. In non-error cases, the data input to the memory controller is selected through the mux 24.

Communication System

Figure 10:
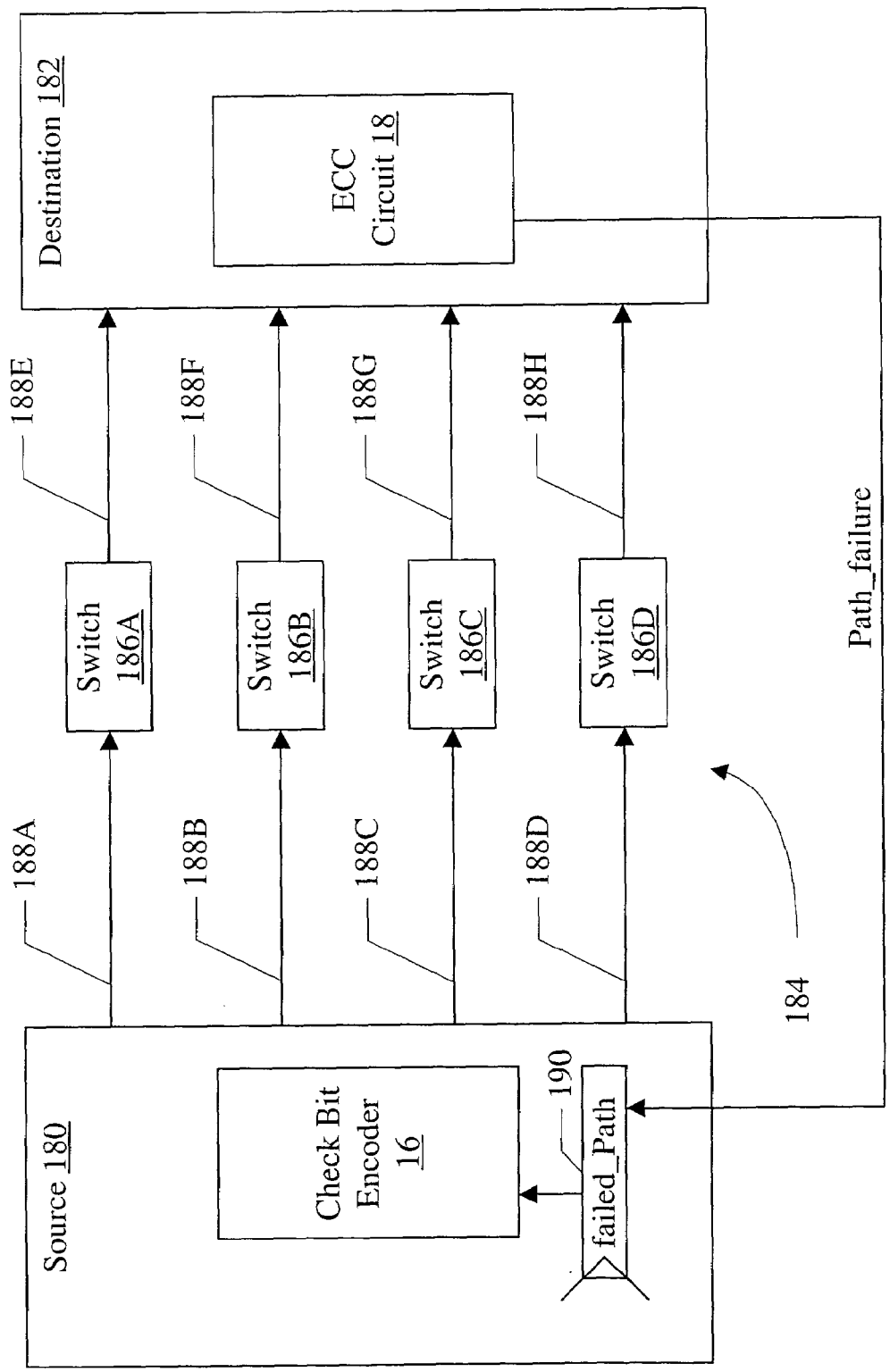
FIG. 10 is a block diagram of one embodiment of a communication system.

Turning now to FIG. 10, a block diagram of one embodiment of a communication system is shown. In the embodiment of FIG. 10, the communication system includes a source device 180 and a destination device 182. The source device 180 includes the check bit encoder circuit 16 (which is similar to the above description with regard to FIGS. 1–9) and may include a persistent state storage 190 which may store an indication of a failed path. The check bit encoder circuit 16 is coupled to the persistent state storage 190, which is coupled to receive an indication of a path failure from the destination 182 (particularly, from the ECC circuit 18). The destination device 182 includes the ECC circuit 18 (which is similar to the above description with regard to FIGS. 1–9). The check bit encoder circuit 16 is coupled to receive unencoded data from within the source device 180 and is configured to encode a packet comprising one or more code words (including the data and check bits) for transmission over the transmission media 184 to the destination device 182. The ECC circuit 18 decodes the code words (detecting any errors according to the check bit definitions and optionally correcting detected errors), and may pass the corresponding received data internally to the destination device 182. The data from a code word that is transmitted through one of the switches 186A–186D may be referred to as a "slice".

In the illustrated embodiment, the transmission media 184 includes conductors coupled between the source device 180 and a set of switches 186 and conductors coupled between the switches 186 and the destination device 182. For example, FIG. 10 illustrates the conductors 188A between the source device 180 and the switch 186A; the conductors 188B between the source device 180 and the switch 186B; the conductors 188C between the source device 180 and the switch 186C; and the conductors 188D between the source device 180 and the switch 186D. Additionally, FIG. 10 illustrates the conductors 188E between the switch 186A and the destination device 182; the conductors 188F between the switch 186B and the destination device 182; the conductors 188G between the switch 186C and the destination device 182; and the conductors 188H between the switch 186D and the destination device 182. Each of conductors 188A–188H may comprise two or more conductors (that is, each switch 186A–186D may be coupled to at least two conductors from the source device 180 and at least two conductors to the destination device 182).

Figure 11:
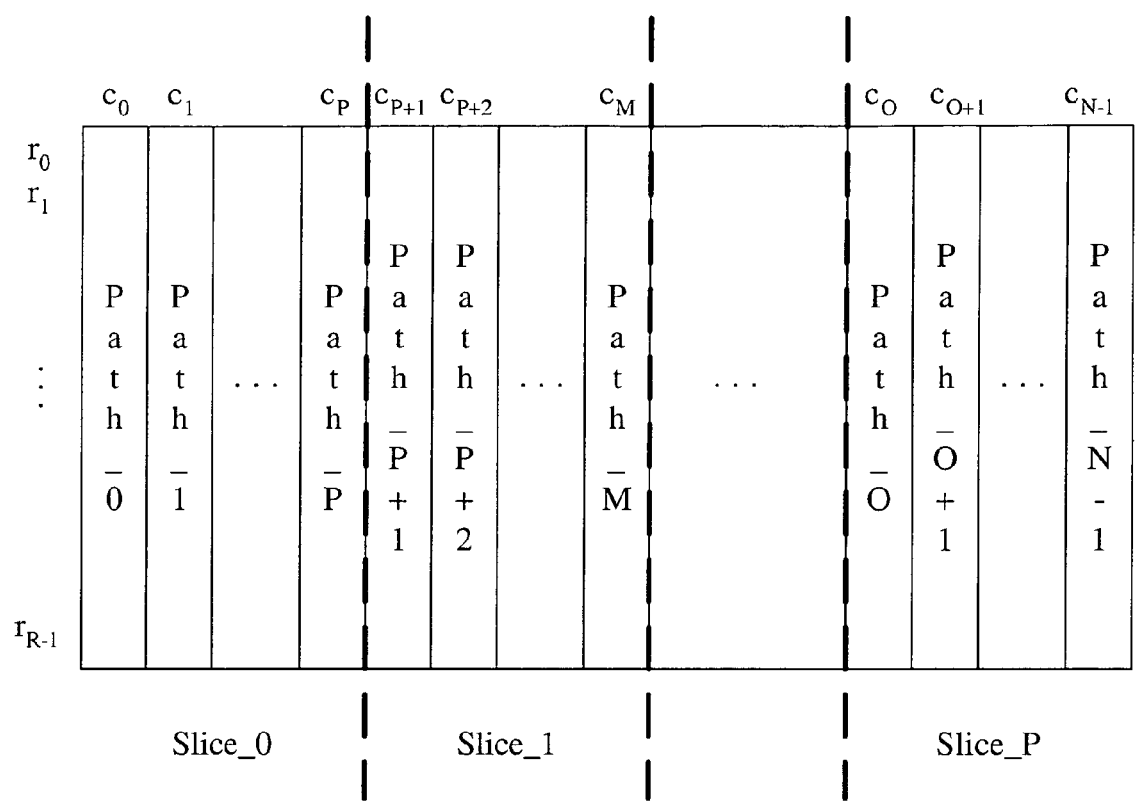
FIG. 11 is a block diagram illustrating a logical array of data bits forming one embodiment of a code word, indicating the transmission of the bits on conductors within slices.

FIG. 11 illustrates one embodiment of a code word which may be used for transmitting data on the transmission medium 184. In the embodiment of FIG. 11, the code word is arranged as a logical array of rows and columns. Each column may correspond to one conductive path (or more briefly, "path") between the source device 180 and the destination device 182. For example, in the embodiment illustrated in FIG. 19, a conductive path may comprise a conductor within conductors 188A and a corresponding conductor within conductors 188E. Thus, in FIG. 11, column zero corresponds to path_0, column 1 corresponds to path_1, etc. Each transmission on a given path which forms part of the code word is a row of the code word. Thus, row 0 may be the first transmission on the paths, row 1 may be the second transmission on the paths, etc.

In the embodiment of FIG. 11, the columns of the array are further delimited by heavy dashed lines to illustrate slices (e.g. slice_0, slice_1, etc., through slice_p). Slice_0 may be the data transmitted through switch 186A, for example, while other slices may be the data transmitted through other switches.

Generally, the various embodiments of check bits in accordance with the above described memory controller may be used in the communication system of FIG. 10. The paths may be handled in a manner similar to memory devices. That is, each path may be treated, for check bit definition, similar to a memory device. Check bits may be carried in any columns of the code word (e.g. column 0 may be used for row check bits, column 1 may be used for inner check bits). Thus, for example, in various embodiments, a failure of a given path may be detected and corrected (and optionally mapped out). Single bit error correction may be supported before, during, and after a mapping out of a given path. Double bit error detection may be supported before failure of a path is detected.

In the embodiment of FIG. 10, the ECC circuit 18 transmits a path_failure indication to the source device 180 in response to detecting a path failure. The failing path may be "mapped out" in this case by ceasing use of the failing path for subsequent packets, and by using one of the other paths to transmit the bits previously transmitted on the failing path (e.g. unused paths, similar to the above described memory device embodiments). In other embodiments, instead of transmitting the path_failure indication to the source device 180, the destination device 182 may inform a service processor of the failure. The service processor may inform the source device 180 (and any other source devices which may use the failing path) to cease using the failing path.

It is noted that, while a single switch is shown for each set of conductors in FIG. 10, each switch may actually be implemented as multiple switches in a hierarchical or peer-to-peer connection between the source device 180 and the destination device 182. Additionally, while a given switch is shown coupled between the source device 180 and the destination device 182, the switch may have additional connections to other destination devices (not shown in FIG. 10) and may route a packet from the source device 180 to one of the destination devices. Furthermore, in other embodiments, the switches 186A–186D may be replaced by any other transmission circuits (e.g. repeaters). Generally, a transmission circuit may include any circuitry coupled to two or more conductors and configured to transmit data on the conductors. In other embodiments, no switches may be employed (e.g. there may be a point-to-point connection between the source device 180 and the destination device 182). In such embodiments, path failures may be detected in a manner similar to memory device failures. In another embodiment, the code word may be defined such that each slice may comprise a column, and data concurrently transmitted on the slice may comprise the rows of the column corresponding to the slice.

Computer System

Turning next to FIG. 12, a block diagram illustrating one embodiment of a computer system including the memory controller 10 and the memory 12 is shown. Additionally, the computer system includes one or more processors (e.g. the processors 60A–60M shown in FIG. 12). The processors 60A–60M are coupled to the memory controller 10 via an interconnect 62. The processors 60A–60M may be sources of read/write requests to the memory controller 10. Additionally, the computer system may include one or more peripheral devices coupled to the interconnect 62 or indirectly coupled through an input/output (I/O) bridge circuit. Furthermore, the computer system may include multiple memories and/or memory controllers. The peripheral devices may also be sources of read/write requests to the memory controller 10.

Numerous variations and modifications will become apparent to those skilled in the art once the above disclosure is fully appreciated. It is intended that the following claims be interpreted to embrace all such variations and modifications.

What is claimed is:

1. An apparatus comprising:

a check bit encoder circuit coupled to receive a data block, wherein the check bit encoder circuit is configured to generate a corresponding encoded data block comprising the data block, a first plurality of check bits, and a second plurality of check bits; and a check/correct circuit coupled to receive an encoded data block, the check/correct circuit configured to detect an error in data from one of a plurality of components and correct the error using the first plurality of check bits, the second plurality of check bits, and the data block within the encoded data block;

wherein the encoded data block is logically arranged as an array of R rows and N columns, wherein R and N are positive integers, and wherein each of the N columns comprises data bits from a respective one of the plurality of components, and wherein the first plurality of check bits form a first column of the array, and wherein each of the first plurality of check bits covers a row of the array, and wherein the second plurality of check bits form a second column of the array and are defined to cover bits in the array according to a plurality of check vectors, each of the plurality of check vectors corresponding to a different bit in the array, and each of the plurality of check vectors is an element of a Galois Field ($GF(2^R)$), and wherein the plurality of check vectors are derived from a plurality of unique elements of $GF(2^R)$, each of the plurality of unique elements corresponding to a different column of the array, and wherein the check vector in row X of the column is the product, in GF($2^R$) of the unique element for that column and alpha$^X$, wherein alpha is a primitive element of GF($2^R$).

2. The apparatus as recited in claim 1 wherein a first element of the plurality of unique elements corresponding to the first column is all zeros, whereby the first column is not covered by the second plurality of check bits.

3. The apparatus as recited in claim 2 wherein a second element of the plurality of unique elements corresponding to the second column is all zeros except for a one in the least significant position, and wherein the position of the one in each of the plurality of check vectors corresponding to the second column defines the location in the second column that stores the corresponding one of the plurality of check bits.

4. The apparatus as recited in claim 1 wherein the plurality of unique elements are selected to provide double bit error detection prior to the apparatus identifying a failure of one of the plurality of components.

5. The apparatus as recited in claim 4 wherein the plurality of unique elements are selected to satisfy the following, where check_vector($r_x$, $c_y$) is the check vector assigned to the bit at row x, column y of the array and XOR is bitwise exclusive OR: for any set of 2 distinct rows $r_1$ and $r_2$ and any set of 3 distinct columns $c_1$, $c_2$, and $c_3$, check_vector($r_1$, $c_1$) XOR check_vector($r_2$, $c_2$) XOR check_vector($r_1$, $c_3$) XOR check_vector($r_2$, $c_3$) is not equal to zero.

6. The apparatus as recited in claim 4 wherein the plurality of unique elements are selected to satisfy the following, wherein each of the plurality of unique elements is denoted UE[column to which the unique element corresponds]: for any integer W between 0 and R−1 (inclusive), for any integers i, j, and k between 0 and N−1 (inclusive), where i is not equal to j and i is not equal to k, and j is not equal to k, UE[i] XOR UE[j] is not equal to the product, in GF($2^R$), of UE[i] XOR UE[k] and alpha$^W$.

7. The apparatus as recited in claim 1 wherein the plurality of unique elements are selected to provide single bit error correction subsequent to the apparatus identifying a failure of one of the plurality of components.

8. The apparatus as recited in claim 7 wherein the plurality of unique elements are selected to satisfy the following, where check_vector($r_x$, $c_y$) is the check vector assigned to the bit at row x, column y of the array and XOR is bitwise exclusive OR: for any set of 2 distinct rows $r_1$ and $r_2$ and any set of 3 distinct columns $c_1$, $c_2$, and $c_3$, check_vector($r_1$, $c_1$) XOR check_vector($r_2$, $c_2$) XOR check_vector($r_1$, $c_3$) XOR check_vector($r_2$, $c_3$) is not equal to zero.

9. The apparatus as recited in claim 7 wherein the plurality of unique elements are selected to satisfy the following, wherein each of the plurality of unique elements is denoted UE[column to which the unique element corresponds]: for any integer W between 0 and R−1 (inclusive), for any integers i, j, and k between 0 and N−1 (inclusive), where i is not equal to j and i is not equal to k, and j is not equal to k, UE[i] XOR UE[j] is not equal to the product, in GF($2^R$), of UE[i] XOR UE[k] and alpha$^W$.

10. A memory controller comprising the apparatus as recited in claim 1, wherein the plurality of components are a plurality of memory devices.

11. A transmission system comprising the apparatus as recited in claim 1 wherein the plurality of components are a plurality of paths on a transmission medium in the system.

12. The transmission system as recited in claim 11 further comprising a source coupled to the plurality of paths to transmit encoded data blocks and a destination coupled to the plurality of paths to receive encoded data blocks, wherein the source comprises the check bit encoder circuit and the destination comprises the check/correct circuit.

13. A computer system comprising:

at least one processor;

at least one memory comprising a plurality of memory devices; and at least one memory controller coupled to the processor and to the memory, wherein the memory controller is coupled to receive data blocks from the processor for storage in the memory and coupled to provide data blocks read from the memory to the processor, and wherein the memory controller is configured to generate a corresponding encoded data block in response to receive a data block from the processor, the encoded data block including a first plurality of check bits, a second plurality of check bits, and the data block, and wherein the memory controller is configured to detect an error in data from one of the plurality of memory devices and correct the error using the first plurality of check bits, the second plurality of check bits, and the data block within the encoded data block;

wherein the encoded data block is logically arranged as an array of R rows and N columns, wherein R and N are positive integers, and wherein each of the N columns comprises data bits from a respective one of the plurality of memory devices, and wherein the first plurality of check bits form a first column of the array, and wherein each of the first plurality of check bits covers a row of the array, and wherein the second plurality of check bits form a second column of the array and are defined to cover bits in the array according to a plurality of check vectors, each of the plurality of check vectors corresponding to a different bit in the array, and each of the plurality of check vectors is an element of a Galois Field (GF($2^R$)), and wherein the plurality of check vectors are derived from a plurality of unique elements of GF($2^R$), each of the plurality of unique elements corresponding to a different column of the array, and wherein the check vector in row X of the column is the product, in GF($2^R$) of the unique element for that column and alpha$^X$, wherein alpha is a primitive element of GF($2^R$).

14. The computer system as recited in claim 13 wherein a first element of the plurality of unique elements corresponding to the first column is all zeros, whereby the first column is not covered by the second plurality of check bits.

15. The computer system as recited in claim 14 wherein a second element of the plurality of unique elements corresponding to the second column is all zeros except for a one in the least significant position, and wherein the position of the one in each of the plurality of check vectors corresponding to the second column defines the location in the second column that stores the corresponding one of the plurality of check bits.

16. The computer system as recited in claim 13 wherein the plurality of unique elements are selected to provide double bit error detection prior to the memory controller identifying a failure of one of the plurality of memory devices.

17. The computer system as recited in claim 13 wherein the plurality of unique elements are selected to provide single bit error correction subsequent to the memory controller identifying a failure of one of the plurality of memory devices.

18. A method comprising:

receiving an encoded data block comprising a data block, a first plurality of check bits, and a second plurality of check bits;

detecting an error in data of the encoded data block that is from one of a plurality of components; and correcting the error using the first plurality of check bits, the second plurality of check bits, and the data block within the encoded data block; wherein the encoded data block is logically arranged as an array of R rows and N columns, wherein R and N are positive integers, and wherein each of the N columns comprises data bits from a respective one of the plurality of components, and wherein the first plurality of check bits form a first column of the array, and wherein each of the first plurality of check bits covers a row of the array, and wherein the second plurality of check bits form a second column of the array and are defined to cover bits in the array according to a plurality of check vectors, each of the plurality of check vectors corresponding to a different bit in the array, and each of the plurality of check vectors is an element of a Galois Field ($GF(2^R)$), and wherein the plurality of check vectors are derived from a plurality of unique elements of $GF(2^R)$, each of the plurality of unique elements corresponding to a different column of the array, and wherein the check vector in row X of the column is the product, in $GF(2^R)$ of the unique element for that column and $alpha^X$, wherein alpha is a primitive element of $GF(2^R)$.

19. The method as recited in claim 18 wherein a first element of the plurality of unique elements corresponding to the first column is all zeros, whereby the first column is not covered by the second plurality of check bits.

20. The method as recited in claim 19 wherein a second element of the plurality of unique elements corresponding to the second column is all zeros except for a one in the least significant position, and wherein the position of the one in each of the plurality of check vectors corresponding to the second column defines the location in the second column that stores the corresponding one of the plurality of check bits.

21. The method as recited in claim 18 wherein the plurality of unique elements are selected to provide double bit error detection prior to identifying a failure of one of the plurality of components.

22. The method as recited in claim 18 wherein the plurality of unique elements are selected to provide single bit error correction subsequent to identifying a failure of one of the plurality of components.

* * * * *